United States Patent [19]

Byer et al.

[11] 3,922,561

[45] Nov. 25, 1975

[54] TUNABLE ELECTROMAGNETIC OSCILLATOR USING [01.4] GROWN $LiNbO_3$ AND METHOD

[75] Inventors: Robert L. Byer, Stanford; Richard L. Herbst, Menlo Park, Calif.

[73] Assignee: The Board of Trustees of the Leland Stanford Junior University, Stanford, Calif.

[22] Filed: Oct. 3, 1974

[21] Appl. No.: 511,604

[52] U.S. Cl. ........... 307/88.3; 321/69 R; 331/107 R

[51] Int. Cl.[2] ........................................... H02M 5/04

[58] Field of Search .................. 307/88.3; 321/69 R; 331/107 R

[56] References Cited

UNITED STATES PATENTS 3,665,205 5/1972 Bridenbaugh et al. ............. 307/88.3

*Assistant Examiner*—Darwin R. Hostetter

*Primary Examiner*—R. V. Rolinec

[57] ABSTRACT

This invention relates to a unique high energy, pulsed, widely tunable, coherent oscillator based on an angle-tuned 1.06 $\mu m$ pumped $LiNbO_3$ parametric oscillator. The oscillator's basic 1.4 $\mu m$ to 4.4 $\mu m$ frequency range is extended to the visible and ultraviolet by second harmonic and sum frequency generation in $LiNbO_3$, $LiIO_3$, and KDP. The parametric oscillator source is estimated to be 30% efficient when pumped with a 10 mJ per pulse or 300 mJ per pulse Nd:YAG laser. Similarly, the following mixing and sum generation steps are also shown to be nearly 30% efficient. The parametric oscillator followed by a crystal of $AgGaSe_2$, CdSe, or $LiNbO_3$ thus efficiently tunes over a spectral range between 0.62 $\mu m$ and 27 $\mu m$. Since all processes aie angle phasematched, the tuning rate is rapid.

7 Claims, 7 Drawing Figures

TUNABLE ELECTROMAGNETIC OSCILLATOR USING [01.4] GROWN $LiNbO_3$ AND METHOD

The gain bandwidth of the oscillator is near 10 $cm^{-1}$. The oscillator can be frequency narrowed by use of two internal etalons or by a birefringent crystal plus an etalon. It is expected that continuous scanning with 1 $cm^{-1}$ resolution will be possible. For higher resolution, the tuning range is approximately 1 $cm^{-1}$, and for single mode operation near 0.1 $cm^{-1}$, the oscillator cavity free spectral range.

The combination of wide turning range at high pulse energies is a unique feature of the tunable coherent source described. In addition, the Nd:YAG pump laser and all optical nonlinear optical elements of this invention operate at or slightly above room temperature and have no inherent properties that would limit the useful operating life with the exception of the flashlamps used to pump the Nd:YAG laser and amplifier. Based on present lifetime data, the flashlamps last to $10^7$ pulses or over 100 days of continuous operation at 10 pps. Thus, in addition to its unique spectral properties, the system described herein has inherently long operational life with minimum required maintenance.

The oscillator herein uses large, high quality $LiNbO_3$ boules grown in the [01.4] direction which lies in the yz plane, 38° to the z axis. Following annealing and poling the material is strain free, striation free and of high optical quality. It is also useful as an electro-optic switch, for second harmonic generation as well as tunable parametric generation over the 1.4 μ to 4.4 μm spectral range.

BACKGROUND AND OBJECTS OF THE INVENTION

This invention relates to a method and apparatus for providing an extended 0.3 μm – 30 μm coherent tunable radiation source. The device is based on a Nd:YAG laser pump source, a singly resonant [01.4] $LiNbO_3$ parametric oscillator and mixing in four nonlinear crystals $AgGaSe_2$, CdSe, $LiNbO_3$. It is expected that the device will achieve continuous scanning at 0.1 $cm^{-1}$bandwidth at 10 mJ energy per pulse at 10 pps in the near infrared and visible, and corresponding performance with the energy reduced by the Manley-Rowe factor in the intermediate and far infrared. Spectral bandwidths of the order of 0.01 $cm^{-1}$appear likely for narrow tuning ranges of approximately 1 $cm^{-1}$.

The features now achieved that are unique to this invention include: 10 mJ energy per pulse; wide infrared tuning range; use of only one set of mirrors; unique bandwidth control and local tuning methods; rapid wide range tuning; and good frequency stability.

In addition to the foregoing, a new crystal of $LiNbO_3$ grown in the [01.4] direction has been successfully grown and finds use not only as disclosed herein, but also as an electrooptic switch and a second harmonic generator.

SUMMARY OF THE INVENTION, BRIEF DESCRIPTION OF THE DRAWINGS, AND DETAILED DESCRIPTION OF THE INVENTION

[01.4] $LiNbO_3$ Crystal Growth $LiNbO_3$ has been known and grown as a boule along the [01.0] axis from a congruent composition near a lithium to niobium ratio of 0.48 mole %. The growth of $LiNbO_3$ cyrstals from a congruent melt plus improved optical quality tests led to uniform high quality [01.0] axis crystals. These crystals have been successfully used in parametric oscillators pumped by a doubled Q-switch Nd:YAG laser output with a tuning range that extends from 0.6 μm to 3.5 μm.

Recently an application for a high energy 1.06 μm pumped $LiNbO_3$ parametric oscillator forced us to re-examine the growth of $LiNbO_3$. For this oscillator, a $LiNbO_3$ crystal up to 5 cm in length at a propagation angle 45° to the optic axis in the negative *yz* quadrant is required. Although previous 1.06 μ parametric oscillators have been demonstrated, they have been limited in output energy due to the short crystals available from [01.0] axis grown boules. Previous growth studies show that $LiNbO_3$ has another possible growth direction in the [01.4] direction which is 38° to the [00.1] axis in the *yz* plane.

$LiNbO_3$ [01.4] boules have now been grown with seeds at the congruent melt composition by the Czochralski technique. The boules were grown at a growth rate of 15 mm per hour with a 10 rpm crystal rotation rate. Following growth, the boule was slowly cooled at a rate of 50°C/hr in an after heater to near room temperature (~150° C). It was then transferred to a low temperature gradient furnace and annealed in $O_2$ at a temperature of 1,200° C. with an oxygen flow of 2½ *lpm*. The heating and cooling rates were programmed at 150° C./hr. and 100° C./hr., respectively.

Following annealing the ends of the boule were sawed off and platinum poling electrodes were applied using platinum paste. The boule was poled at 1,200° C. by applying 1.25V/cm poling field along the boule axis for one hour; oxygen flow and heating and cooling rates were the same as those described for annealing. The sign of the poling field was chosen so that the boule axis lie in the negative *yz* quadrant. This is essential in nonlinear optical applications in order to maximize the nonlinear coefficient. The effective nonlinear coefficient is $d_{eff} = d_{31} \sin\theta + d_{22} \cos\theta \sin 3\phi$ where $\theta$ and $\phi$ are angles referenced to the *z* and *x* axes and $d_{31}$ and $d_{22}$ are known to be of opposite sign.

Several [01.4] oriented $LiNbO_3$ boules have now been grown. To date all of the boules have provided high quality material. Typical boules are 25 mm in diameter by 90 mm in length. The boules have been strain free and of uniformly high optical quality. Fabrication into bars or cylinders has proceeded without difficulty.

We have used [01.4] $LiNbO_3$ material in an electro-optic modulator and 1.06 μ pumped parametric oscillators. The electro-optic modulator was constructed from three crystals, 2 mm × 2 mm × 25 mm cut with the length along the optic axis. The modulator has operated with a 20 to 1 open to close ratio and has been used for switching a single pulse at 1.06 μ from a mode locked laser pulse train.

Parametric oscillators have been constructed using [01.4] material. The oscillators were directly pumped with a 20 nsec pulse at 1.06 μm from an electro-optic Q-switched Nd:YAG laser operating in the $TEM_{oo}$ mode. The measured threshold energy was 4 mJ. At 15 mJ input, the oscillator had a measured conversion efficiency of 10%. The oscillator operated at room temperature and angle tuned from 1.399 μm to 4.4 μm. A more detailed discussion of this widely tunable oscillator will now be presented.

In general, the tunable oscillator of the present invention comprises a 1.06 $\mu$m in Nd:YAG laser amplifier driver coupled to the input of an angle tuned $LiNbO_3$ [01.4] singly resonant parametric oscillator. The pump is a Nd:YAG oscillator electro-optically Q-switched using a Kd*P Pockels cell of standard design. The pump oscillator is operated $TEM_{00}$ mode and substantially single frequency by proper aperture and etalon control. Nd:YAG lasers meeting this requirement are presently in operation.

Figure 1:
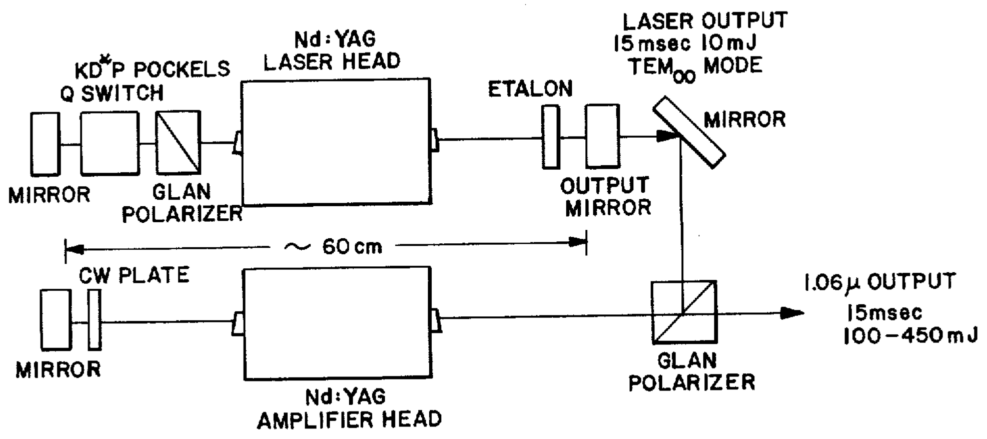
FIG. 1 is a schematic of the 1.06μ Nd:YAG laser-amplifier driver for use in the present invention.

The Nd:YAG laser is followed by a double-pass Nd:YAG amplifier. The amplifier increases the Nd:YAG laser energy from 10 mJ to between 100 and 450 mJ depending on the filling factor of the amplifier rod. For this case, the rod diameter is 6 mm and the length is 76 mm. If required, a further increase in energy output can be achieved with a second amplifier rod 1 cm in diameter and 76 mm in length. FIG. 1 shows a schematic of the Nd:YAG pump.

Figures 2, 3, 4:
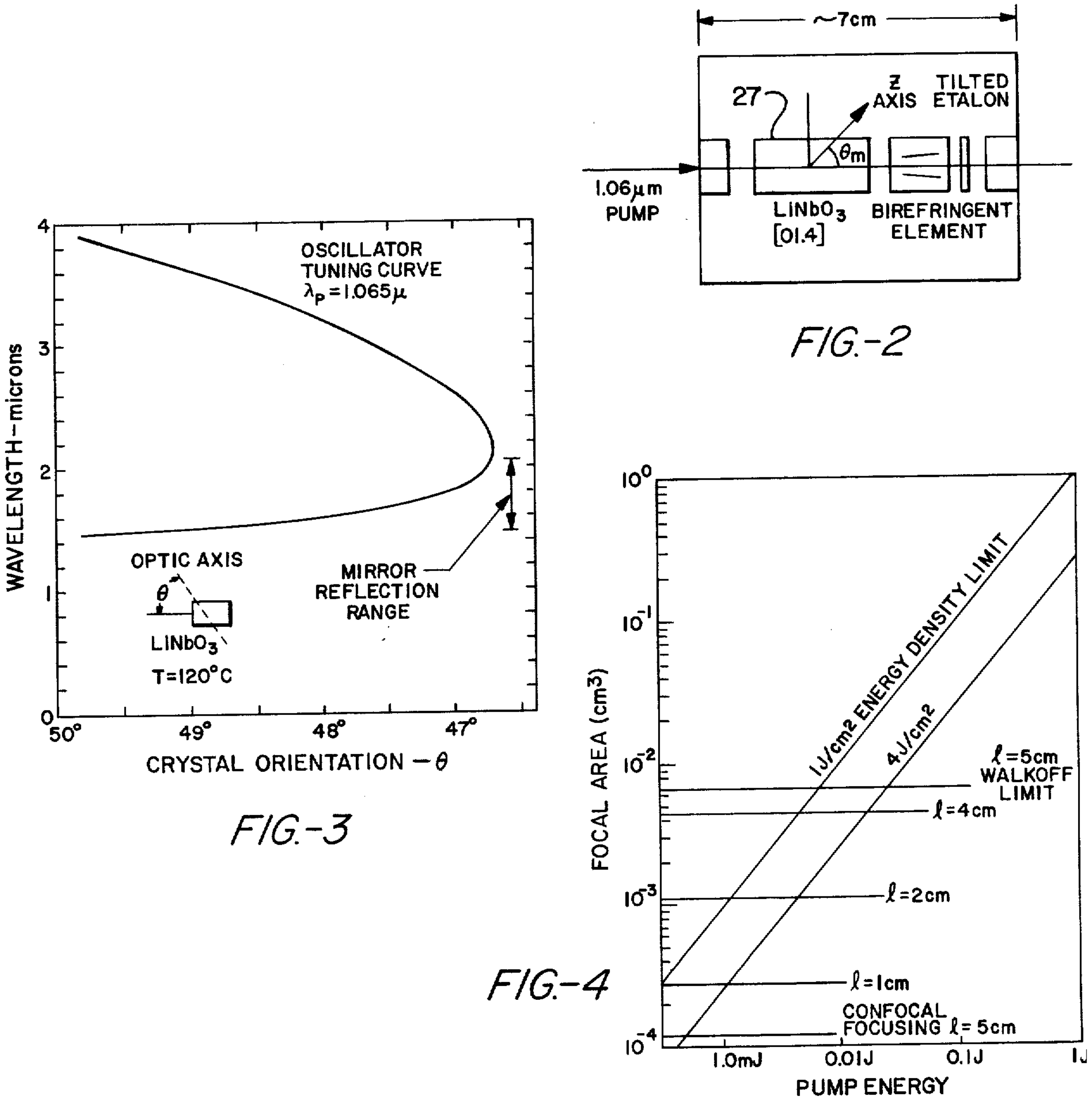
FIG. 2 is a full scale schematic of the angle tuned $LiNbO_3$ [01.4] singly resonant parametric oscillator constructed in accordance with the present invention.
FIG. 3 is a tuning curve for the $LiNbO_3$ oscillator vs. crystal angle. The mirror reflection range is indicated.
FIG. 4 is damage limited focal areas vs. input pump energy for $LiNbO_3$. The plane wave gain approximation applies for input energies greater than 8 mJ at $l = 5$ cm.

The $LiNbO_3$ parametric oscillator operates in the singly resonant mode with tuning achieved by crystal rotation. FIG. 2 illustrates the schematic of the oscillator including bandwidth control elements. FIG. 3 shows the tuning curves versus crystal angle for a fixed temperature near 120°C.

The $LiNbO_3$ parametric oscillator is the key element in the chain of tuning elements that follows. Therefore, threshold, conversion efficiency, tuning method and bandwidth have been considered in detail.

For angle-tuned parametric oscillators, the pump beam area must be greater than an area determined by the Poynting vector walk-off and crystal aperture length. Calculations show that for a 2 cm crystal 1 mJ of input pump energy is required to reach maximum gain for off angle phasematched crystals. In this focusing limit, the parametric oscillator gain simplifies to $$G = \frac{K P_{30} l^2 (1-\delta^2)^2}{(\pi w_0^2/2)}$$

for both 90°and off-angle phasematched crystals. Here $K = (\omega_0^2 d/n_0^3 n_3 \epsilon_0 c^3)$, $P_{30}$ is the pump power, $l$ the crystal length and $\delta$ the degeneracy factor. For example, for 5 cm long crystals the gain is maximum at 0.1 mJ for 1 J/cm² damage threshold at 90° phasematching. For 45° phasematching, the gain is maximum for energies greater than 8 mJ. At this energy, the gain for off-angle phasematching equals that for 90° phasematching for the limiting input intensity and there is no requirement for the use of 90°crystals. This is shown schematically in FIG. 4.

The calculated gain for the parametric oscillator is $\Gamma^2 l^2 = 0.32$ at 1 MW/cm² for a 5 cm crystal. At the 80 MW/cm² burn-density limit, the parametric oscillator gain at degeneracy is

| | |
|---|---|
| $\Gamma^2 l^2 = 1.0$ | $l = 1$ cm |
| $= 4.0$ | $= 2$ cm |
| $= 9.0$ | $= 3$ cm |
| $= 16.0$ | $= 4$ cm |
| $= 25.0$ | $= 5$ cm |

For efficient operation, gains greater than 4 are adequate. Presently available $LiNbO_3$ y-axis boules allow crystal lengths up to 2.0 cm. For longer crystals, special boules have been grown in the [01.4] direction and poled to [01.$\bar{4}$]. We have recently evaluated a [01.$\bar{4}$] grown boule and have shown that quality crystals up to 5 cm in length can be provided at 46°phasematching angle. As used herein, [01.$\bar{4}$] refers to a direction perpendicular to the 01.4 plane of the crystal and $\bar{4}$ refers to the negative quadrant.

The important conclusion, reached here for the first time, is that parametric oscillator operation at 45° phasematching has the same gain characteristic as 90° phasematched operation for pump energies greater than 8 mJ. The electro-optic Q-switched Nd:YAG laser source meets this requirement even without the following amplifier. The amplifier does provide a significant increase in output energy that may improve the usefulness of this source for certain experiments. It is, however, not required for the successful operation of the widely tunable device.

Figure 5:
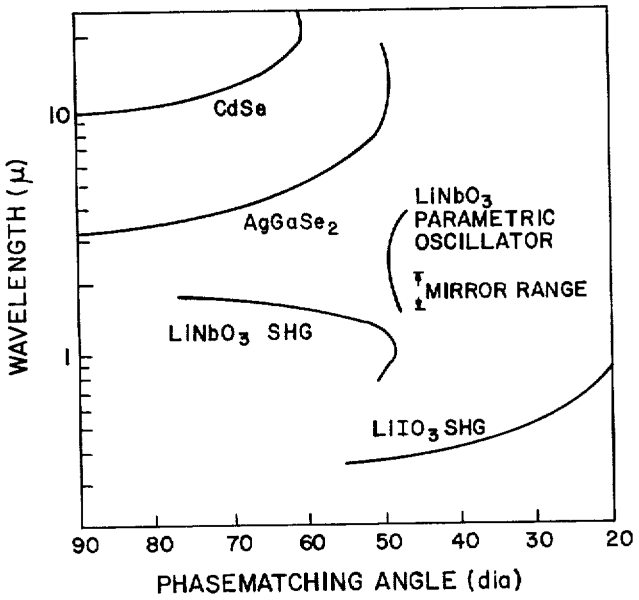
FIG. 5 is the spectral range vs. crystal angle for the $LiNbO_3$ oscillator and following nonlinear crystal harmonic, sum, and mixer generators.

The output of the parametric oscillator tunes between 1.4 $\mu$m and 4.4 $\mu$m using a single set of reflecting optics. This basic frequency range can be extended to cover the 3 $\mu$m to 18 $\mu$m region in $AgGaSe_2$ and the 10 $\mu$m to 27 $\mu$m region in CdSe. Various sum generation processes also are possible in $LiNbO_3$ and $LiIO_3$. For example, second harmonic generation of the idler in $LiNbO_3$ covers the 1.06 $\mu$m → 1.6 $\mu$m region, and second harmonic generation of the signal in $LiNbO_3$ covers the 0.75 $\mu$m → 1.06 $\mu$m region. These processes angle phasematch and should be ~30% efficient. In addition, 1.06 $\mu$m+idler in $LiNbO_3$ and 1.06 $\mu$m+signal in $LiNbO_3$ cover the 0.7 $\mu$m → 0.8 $\mu$m and 0.6 $\mu$m → 0.7 $\mu$m spectral range. Because of the high 1.06 $\mu$m power available, these steps are also efficient. The above steps all involve a single angle phasematched $LiNbO_3$ crystal. There may not be any requirement to generate wavelengths shorther than 6000 A; however, by use of a second crystal to sum the oscillator and its second harmonic in $LiIO_3$, the spectral range from 3300 A to 7000 A can also be covered. FIG. 5 illustrates the spectral range versus phasematching angle reached by the $LiNbO_3$ parametric oscillator and the following mixers and sum generators.

Figure 6:
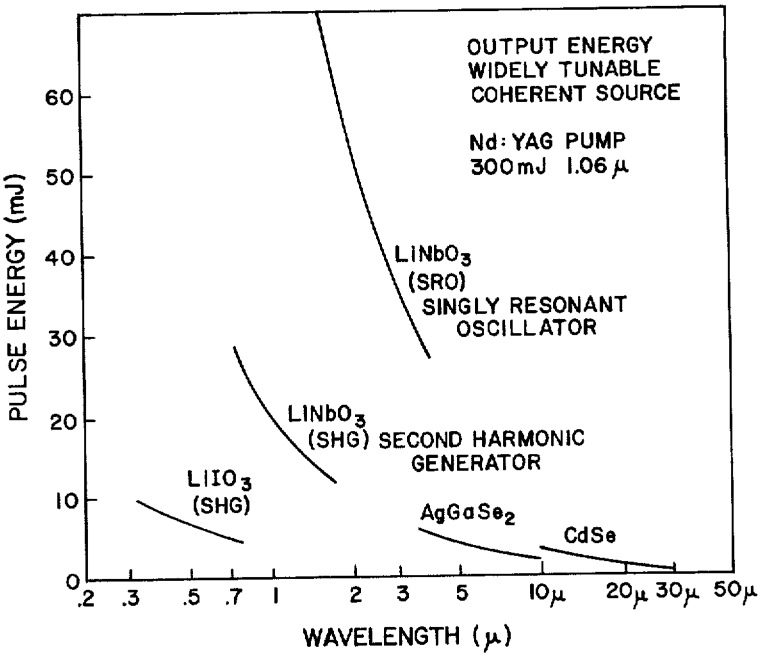
FIG. 6 is the predicted output energy vs. wavelength for the high energy tunable source.

Conservative predictions of the conversion efficiency of the parametric oscillator and the following mixers and doublers have been made. FIG. 6 shows the expected output pulse energy versus wavelength across the spectral regions covered. For this estimate, we assumed 300 mJ of pumping energy and only a 30% conversion efficiency in the oscillator. Higher pump energies, up to 1 J per pulse, are possible in a Nd:YAG amplifier system but at added cost and complexity of an additional amplifier rod. Experimental measurements with the tunable source as a differential absorption transmitter must be made to fully evaluate whether 10 mJ per pulse is adequate energy at 10 pps.

The 1.06 $\mu$m Nd:YAG laser pumped $LiNbO_3$ parametric oscillator forms a nearly ideal primary source for widely tunable 2200 A to 1.5 $\mu$m radiation by second harmonic and sum generation, 1.4 $\mu$m to 4.4 $\mu$m by parametric oscillation, and 3.0 $\mu$m to 27 $\mu$m by phasematched mixing.

Figure 7:
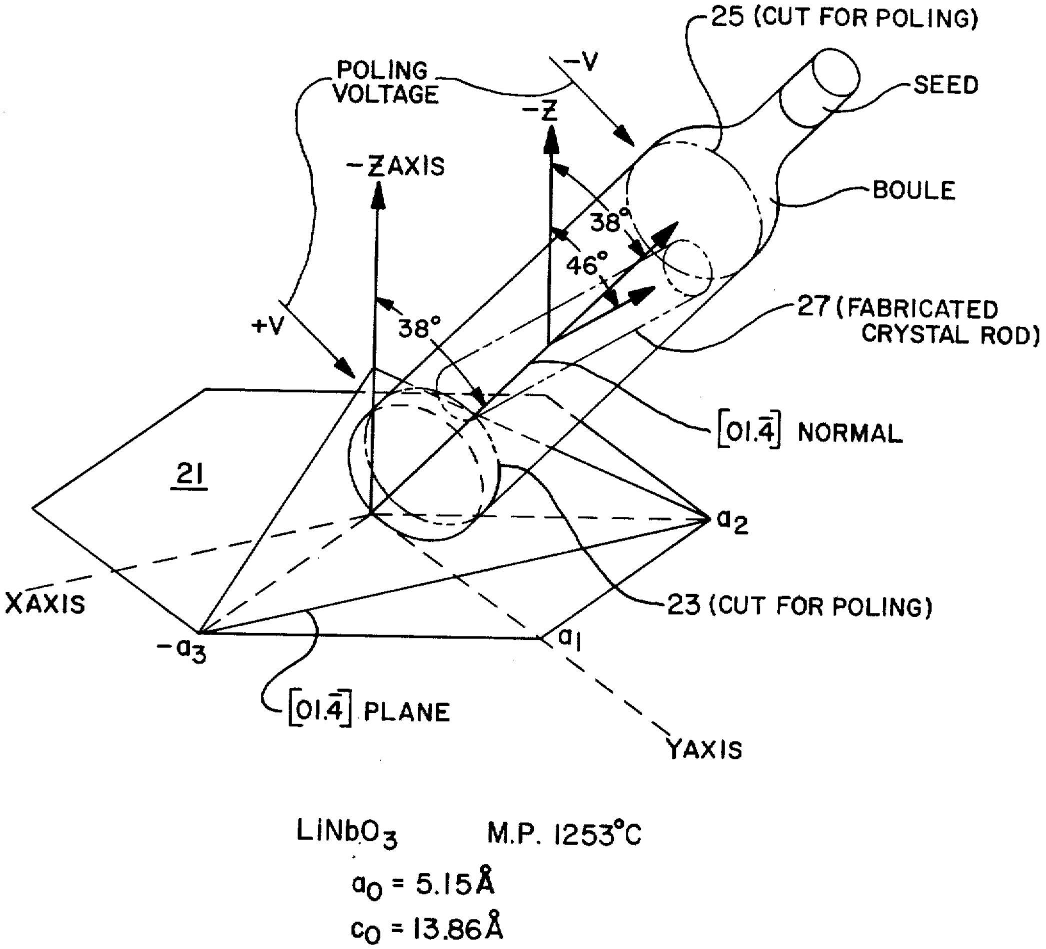
FIG. 7 is a schematic drawing depicting the relationship of the [01.4] $LiNbO_3$ grown boule of the present invention to the hexagonal crystal structure of $LiNbO_3$.

Referring to FIG. 7, the usual hexagonal crystal structure model of $LiNbO_3$ is depicted by the base 21, and upstanding vertical $z$. Superimposed is shown a boule grown along the normal $\vec{n}$ [01.4] to the 01.4 plane which makes the angle of about 38° to the $z$ axis. Subsequently, the boule is cut at planes 23, 25 and poled by applying the electric field poling voltage across these faces. After poling the fabricated crystal rod 27 is cut from the boule along the 46° direction indicated by the vector $\vec{k}$.

We claim:

1. In an electromagnetic oscillator, means for providing a pump electromagnetic radiation beam having an output at a predetermined frequency, a crystal of $LiNbO_3$ grown in the direction perpendicular to [01.4] and poled to [01.4], means for supporting and orienting said crystal at a phasematching angle to said pump beam and in a path thereof.

2. An electromagnetic oscillator as in claim 1 further including means for varying the orientation, $\theta$, of said crystal to provide a variable output over the range from 1.4 to 4.4 $\mu$m

3. A crystal oscillator as in claim 2 further including means coupled to the output of said crystal for converting the output thereof to other predetermined ranges.

4. An oscillator as in claim 3 in which said conversion means is $AgGaSe_2$ and in which said other range is from 3 to 18 $\mu$m.

5. An oscillator as in claim 3 in which said conversion means is CdSe and in which said range is 10 to 27 $\mu$m.

6. An oscillator as in claim 3 in which said conversion means is [01.4] $LiNbO_3$ serving as a second harmonic generator, and in which said range is from 7000 A to 1.4 $\mu$m.

7. An oscillator as in claim 3 in which said conversion means is [01.4] $LiIO_3$ serving as a second harmonic generator and in which said range is from 3300 to 7000 A.

* * * * *